United States Patent
Pöchmüller (10) Patent No.: US 7,203,123 B2
(45) Date of Patent: Apr. 10, 2007

(54) INTEGRATED DRAM MEMORY DEVICE

(75) Inventor: Peter Pöchmüller, Dresden (DE)

(73) Assignee: Infineon Technologies AG, Munich (DE)

(*) Notice: Subject to any disclaimer, the term of this patent is extended or adjusted under 35 U.S.C. 154(b) by 181 days.

(21) Appl. No.: 11/006,865

(22) Filed: Dec. 8, 2004

(65) Prior Publication Data

US 2006/0120200 A1    Jun. 8, 2006

(51) Int. Cl.
*G11C 8/00*    (2006.01)

(52) U.S. Cl. ............... 365/230.03; 365/63; 365/206; 365/207

(58) Field of Classification Search ........... 365/230.03, 365/63, 206, 207
See application file for complete search history.

(56) References Cited

U.S. PATENT DOCUMENTS 5,986,943 A * 11/1999 Isa .................. 365/189.04
6,683,816 B2 * 1/2004 Emmot et al. ......... 365/230.03

* cited by examiner

*Primary Examiner*—Tuan T. Nguyen
*Assistant Examiner*—Nam Nguyen
(74) *Attorney, Agent, or Firm*—Patterson & Sheridan, L.L.P.

(57) ABSTRACT

An integrated memory device including a number of memory blocks including memory cells wherein the memory cells are arranged in a matrix of wordlines and bitlines, wherein the number of memory blocks including a first set of memory blocks the memory cells thereof having a first random access time and a second set of memory blocks the memory cells thereof having a second random access time, wherein the second random access time is smaller that the first random access time.

16 Claims, 6 Drawing Sheets

INTEGRATED DRAM MEMORY DEVICE

BACKGROUND OF THE INVENTION

1. Field of the Invention

The present invention is related to a design of an integrated Dynamic Random Access Memory (DRAM) memory device, especially a design for speeding up the accessing of data in an integrated DRAM memory device.

2. Description of the Related Art

Although the data transfer frequency of DRAM memory devices increases constantly, the access time for data which is randomly accessed remains substantially constant. The decrease of access time of memory cells in a memory device is limited by the physical dimensions and the design and layout of the cell array. Random accessing of data requires selectively changing (activating and deactivating) the wordlines and bitlines frequently which requires a minimum time which can hardly be reduced by shrinking the physical dimensions and/or by changing the memory layout.

The random access speed in memory devices can be increased for example by substantially decreasing the number of cells connected to a single bitline/wordline. However, to keep the overall memory capacity constant, the necessary memory area on chip would substantially increase as the number of bitlines is increased, each being connected with a respective sense amplifier and other support circuit elements. This would be too costly as the overall chip size is substantially increased.

As the random access speed is substantially limited by the bitline and wordline length of a basic memory block, memory arrays with a shrunken bitline length and wordline length are provided when the random access time of the memory block has to be decreased.

SUMMARY OF THE INVENTION

One aspect of the present invention provides a memory device with quick access for random access data wherein the required chip size is not substantially affected.

Another aspect of the present invention provides a memory controller for controlling access to a memory wherein the access time may be optimized.

Furthermore, yet another aspect of the present invention provides a method for controlling access to a memory device with an improved access time.

According to a first aspect of the present invention, an integrated DRAM memory device is provided comprising a number of memory blocks including memory cells wherein the memory cells are arranged in a matrix of wordlines and bitlines. The number of memory blocks includes a first set of memory blocks, the memory cells thereof having a first random access time, and a second set of memory blocks, the memory cells thereof having a second random access time, wherein the second random access time is smaller (or less) than the first random access time.

According to one embodiment of the present invention, a first set of memory blocks includes memory cells arranged on first bitlines, and a second set of memory blocks includes memory cells arranged on second bitlines, wherein the second bitlines are designed having smaller bitline capacities than the first bitlines. The second bitlines may comprise a length which is shorter than the length of the first bitlines.

According to another embodiment of the present invention, the first set of memory blocks includes memory cells arranged on first wordlines and first bitlines, and the second set of memory blocks includes memory cells arranged on second wordlines and second bitlines. An address input port for providing an address to an address decoder is provided. The address decoder is designed to activate one of the wordlines depending on the address applied on the address input port such that an addressed memory portion of at least one of the first memory blocks is selected when data stored or to be stored in the first set of memory blocks is to be addressed by the address and to activate more than one of the wordlines depending on the address applied on the address input port such that an address memory portion of at least one of the second memory blocks is selected when data stored or to be stored in the second set of memory blocks is to be addressed by the applied address.

According to another aspect of the present invention, the first set of memory blocks includes memory cells arranged on first wordlines and first bitlines, and the second set of memory blocks includes memory cells arranged on second bitlines, wherein first sense amplifier units are connected to the first bitlines and second sense amplifier units are connected to the second bitlines, wherein the signal driving capability of the second sense amplifier units is increased compared with the signal driving capability of the first sense amplifier units.

According to another embodiment of the present invention, the first bitlines are coupled to first sense amplifiers, and the second bitlines are coupled to second sense amplifiers. The first sense amplifiers are coupled via a first column decoder to secondary sense amplifiers by means of first data lines, and the second sense amplifiers are coupled via a second column decoder to the secondary sense amplifiers by means of second data lines. Secondary sense amplifiers are arranged relatively close to the second set of memory blocks.

According to another aspect of the present invention, a memory controller for controlling access to a memory device is provided. The memory controller includes a control unit to access a physical address of the memory device such that data is stored or retrieved from the physical address of the memory device. Furthermore, a mapping unit is provided to map an actual address associated to a data to the physical address of the data in the memory device such that a first type of data is written to and read from a first physical address range of the memory device located in the first memory block and a second type of data is written to and read from a second physical address range of the memory device located in a second memory block. The second type of data is data to be accessed faster than the first type of data. The second type of data may include random access data, and the first type of data may include data to be accessed in blocks. The second type of data may include instruction data, and the first type of data may include bulk data.

According to another aspect of the present invention, a method for controlling access to a memory device is provided. The method comprises the steps of mapping an actual address of data to a physical address of the data such that a first type of data is written to and read from a first physical address range of the memory device and a second type of data is written to and read from a second physical address range of the memory device, wherein the second type of data is data to be accessed within a shorter access time than the first type of data. Accessing the physical address of the memory device is performed such that the data indicated by the actual address may be accessed.

BRIEF DESCRIPTION OF THE DRAWINGS

These and other aspects and features of the present invention will become clear from the following description taken in conjunction with the accompanying drawings in which.

DETAILED DESCRIPTION OF THE PREFERRED EMBODIMENT

Figure 1:
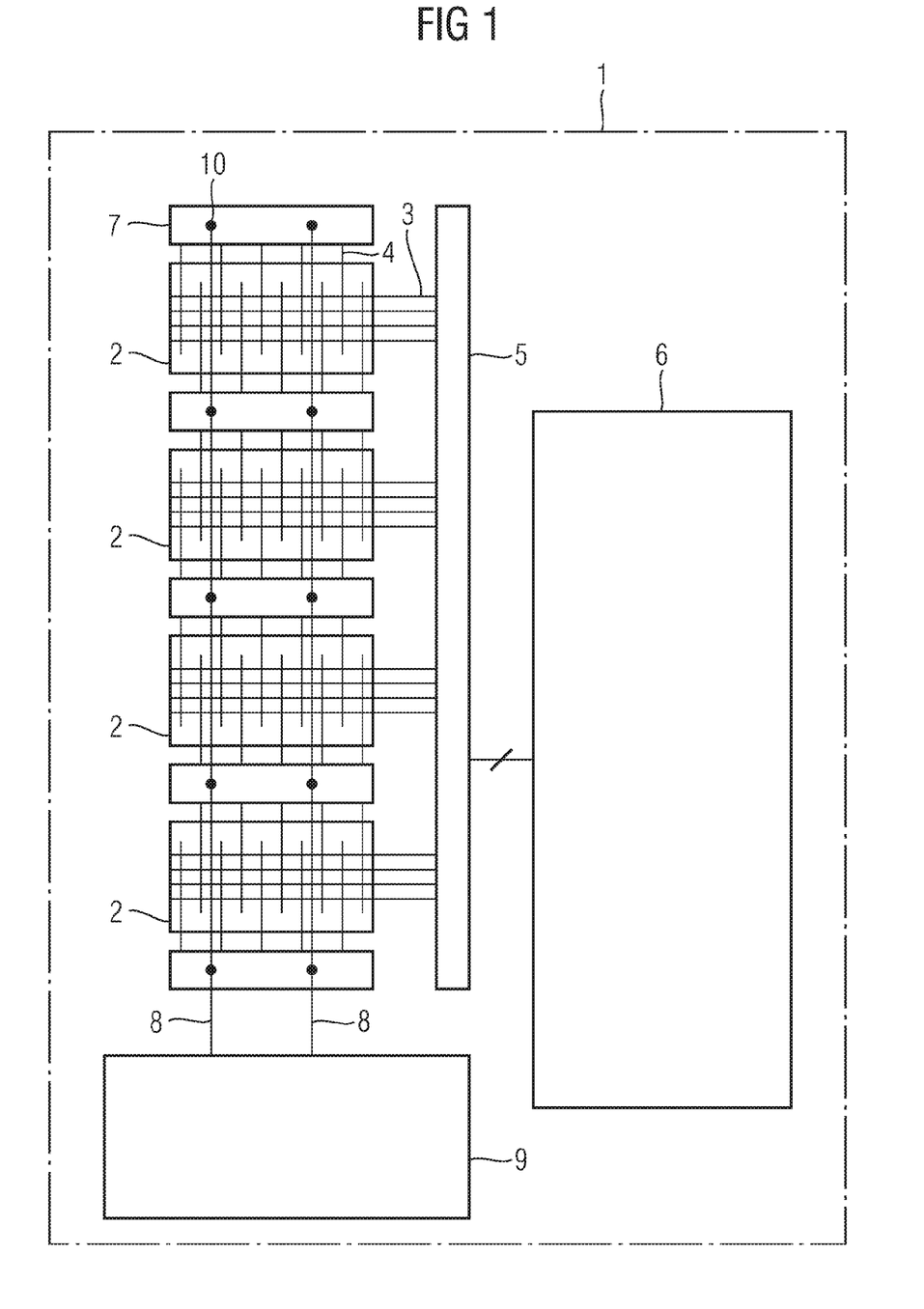
FIG. 1 is a conventional DRAM memory device according to the prior art.

Referring to FIG. 1, a conventional DRAM memory device is depicted. The memory device 1 comprises a number of memory blocks 2, each including memory cells. In the example shown, four memory blocks are provided. The memory cells are arranged in a matrix of wordlines 3 and bitlines 4, wherein the memory cells are designed as, for instance, a one-transistor memory cell which stores information in a storage capacitor. For ease of graphical representation, the memory cells are not shown in the Figures. The wordlines 3 are connected to an address decoder 5 which activates a selected wordline 3 depending on an address provided by a memory control unit 6 or from outside of the memory device, respectively. The bitlines 4 are connected to sense amplifiers which are provided on two sides of the memory blocks 2, wherein each of the sense amplifier units 7 provides one sense amplifier for each connected bitline 4 (a "bitline" may comprise a physical "bitline pair"). To each of the sense amplifier units 7, one half of the number of bitlines 4 for one memory block 2 is connected so that one half of the bitlines 4 is in connection with the sense amplifier unit 7 on one side of the memory block 2 and the other half of the bitlines 4 is in connection with the other sense amplifier unit 7 on the other side of the memory block 2 so that the bitlines interdigitate each other. This arrangement may provide more space for each single sense amplifier in the sense amplifier units 7 as compared to the typical arrangement which has all of the sense amplifiers arranged on one side of the memory block 2.

The sense amplifier units 7 are in connection to secondary sense amplifiers 9 via selector switches 10 which selectively match the respective output of sense amplifier associated to a respective bitline to the secondary sense amplifier 9. The selector switches 10 are controlled by a column select line (not shown) which indicates which of the bitlines should be accessed and coupled via the sense amplifier and via the data line 8 to the secondary sense amplifier 9.

The access time for accessing one memory cell of the memory blocks 2 is determined by the time for activating the addresses wordline 3 and for detecting the load of the storage capacitor of the selected bitline and to forward the detected information to the associated selector switch 10.

Conventionally, the memory blocks 2 of the memory device 1 are designed similarly so that the access times for each of the memory cells of the memory blocks 2 are equal.

The access time of all memory cells is restricted to design limitations, particularly restricted by signal delays of wordlines and bitlines which depend on the driving capability of the respective drivers, the length of the wordlines and bitlines, and the detection speed of the sense amplifiers due to the capacity of the storage capacitors. Shortening the access times for the memory cells would increase the need for chip area which in turn would decrease the yield of manufacturing and increase the price of such a memory device. Therefore conventional memory devices provide a compromise between chip size and access time.

According to one embodiment of the present invention, the memory blocks of the memory device may be divided into two different sets of memory blocks having different access times for randomly accessing data therein. A first set of the memory blocks may be designed as conventional memory devices, and a second set of memory blocks is adapted to provide a shorter access time for accessing data, i.e., to read data from or to write data into the memory block in a shorter time.

Figure 2:
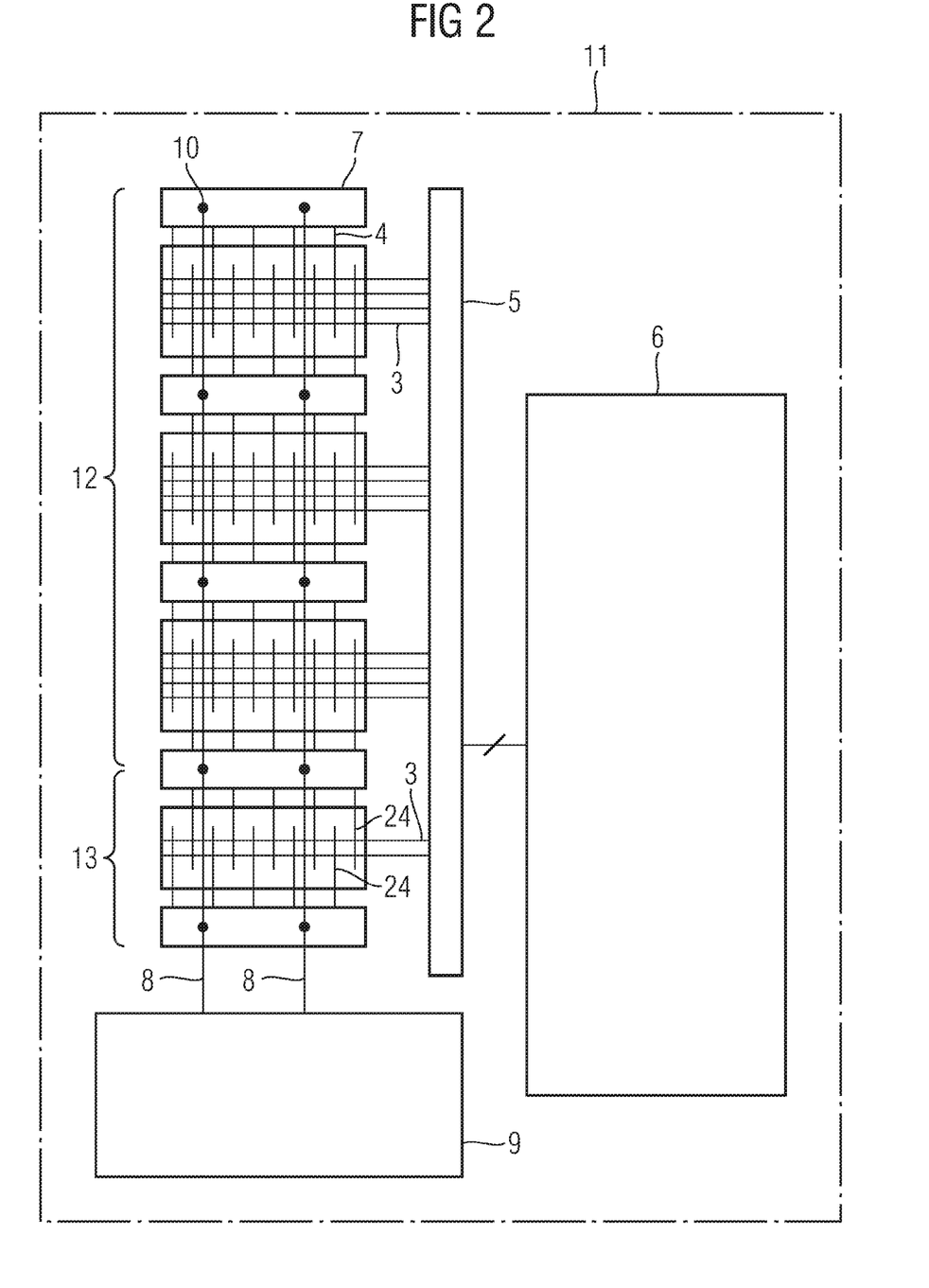
FIG. 2 is a block diagram showing a DRAM memory device according to a first embodiment of the present invention.

One example for two different sets of memory blocks having different access times is depicted in a memory device 11 shown in FIG. 2. In FIG. 2, as well as in the subsequent Figures, blocks or elements having the same or similar function are referred to by the same reference number. Blocks or elements having the same or similar function as those described in FIG. 1 are also referred to by the same reference number.

In FIG. 2, the first set of memory blocks is referenced by the number 12 (referred to herein also as first memory block 12), and the second set of memory blocks is referred to by the number 13 (referred to herein also as second memory block 13). Each set of memory blocks 12, 13 may include one or more memory blocks. The first set of memory blocks 12 is substantially identical to the memory blocks 2 of the prior art DRAM memory device 1 as shown in FIG. 1. The memory cells of the first set of memory blocks 12 may be accessed in a first access time defined by the design parameters as described above. The memory blocks of the second set of memory blocks 13 are designed with different design parameters. In the embodiment shown in FIG. 2, the length of the bitlines 24 in the second set of memory blocks 13 is decreased so that the overall bitline capacity is decreased. Signals on the bitlines 24 therefore can toggle in a shorter time, thereby decreasing the access time of the memory cells of the second set of memory blocks 13. To maintain the overall memory capacity (memory space), instead of one memory block of the first set of memory blocks 12, two second memory blocks 13 are provided, each having half of the capacity of a first memory block 12. Each of the second memory blocks 13 then includes bitlines 24 having lengths which are reduced by half, for instance, as compared to the bitlines 4 of the first memory blocks 12.

Figure 3:
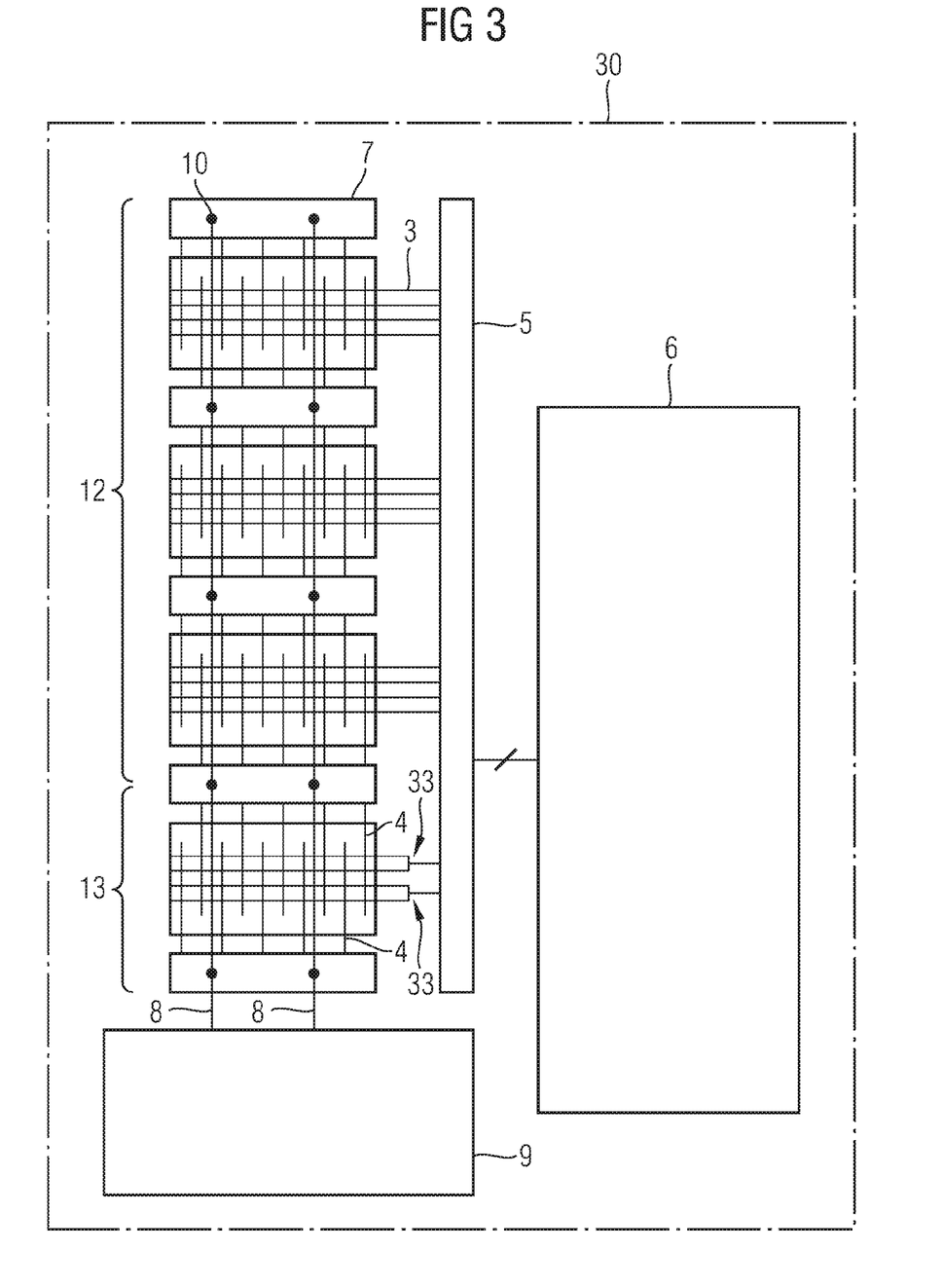
FIG. 3 is a block diagram showing a DRAM memory device according to a second embodiment of the present invention.

In FIG. 3, another embodiment of the present invention is depicted as memory device 30. To increase the access time for the memory cells of the second memory blocks 13, a so called twin-cell-concept may be utilized. The twin-cell-concept provides that more than one wordline is simultaneously activated (e.g., a wordline pair 33) so that the information stored in more than one memory cell can be accessed. The information of two memory cells is then dumped on the same bitline (or bitlines of the same bitline pair) by applying a single row address for activating the wordlines. Thus, the read cycle is strengthened which accelerates the speed of the sense amplifier and therefore decreases array access time.

Figure 4:
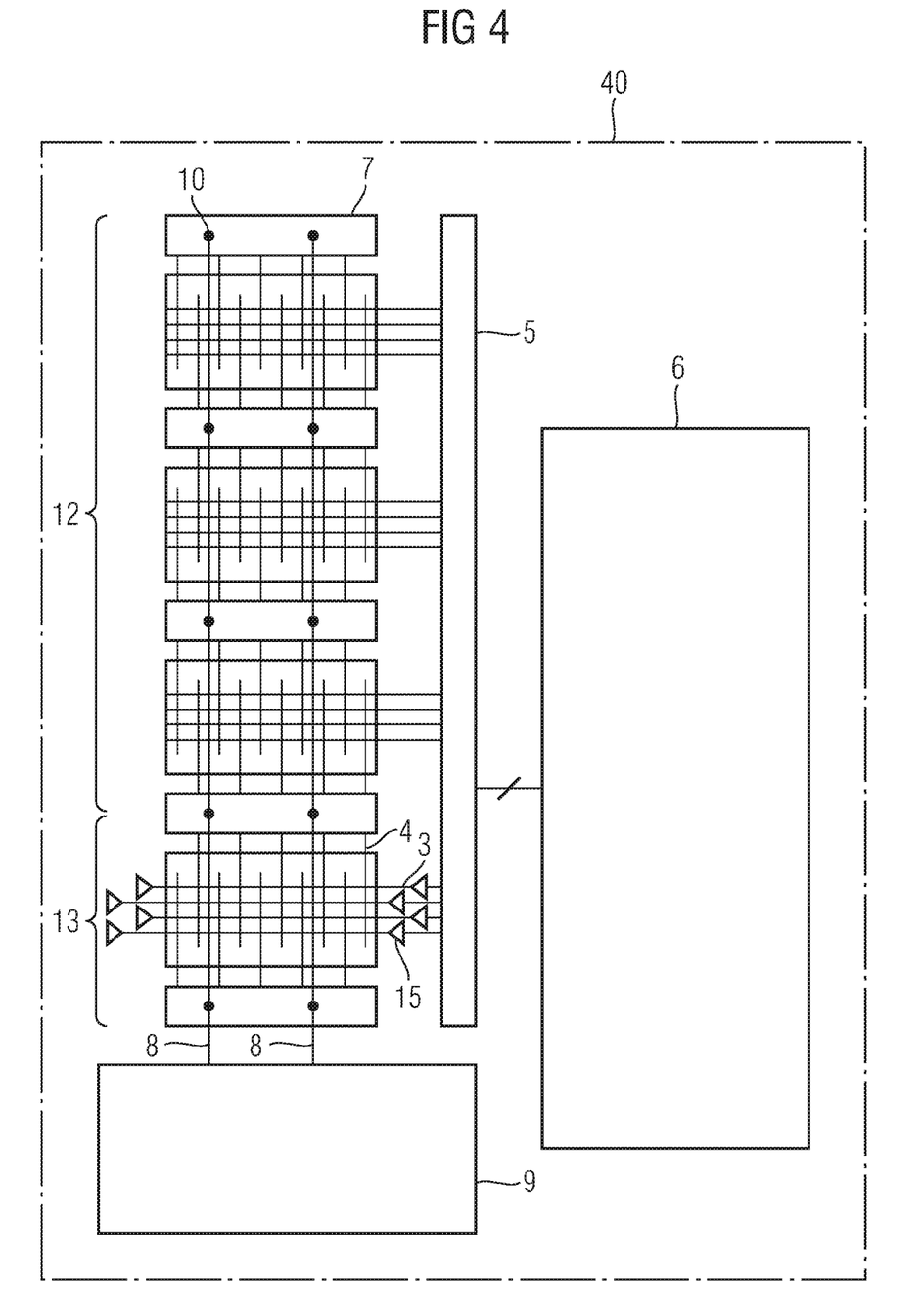
FIG. 4 is a block diagram showing a DRAM memory device according to a third embodiment of the present invention.

In FIG. 4, another embodiment of the present invention is shown as memory device 40. Since a wordline has a substantive length, the memory cells with the largest distance from the wordline driver 15 will be activated with a considerable delay. By providing wordline drivers 15 with an increased driving capability and by applying wordline drivers on both sides of the wordlines 3 (being simultaneously activated), this delay can be reduced, thereby improving the access time.

Figure 5:
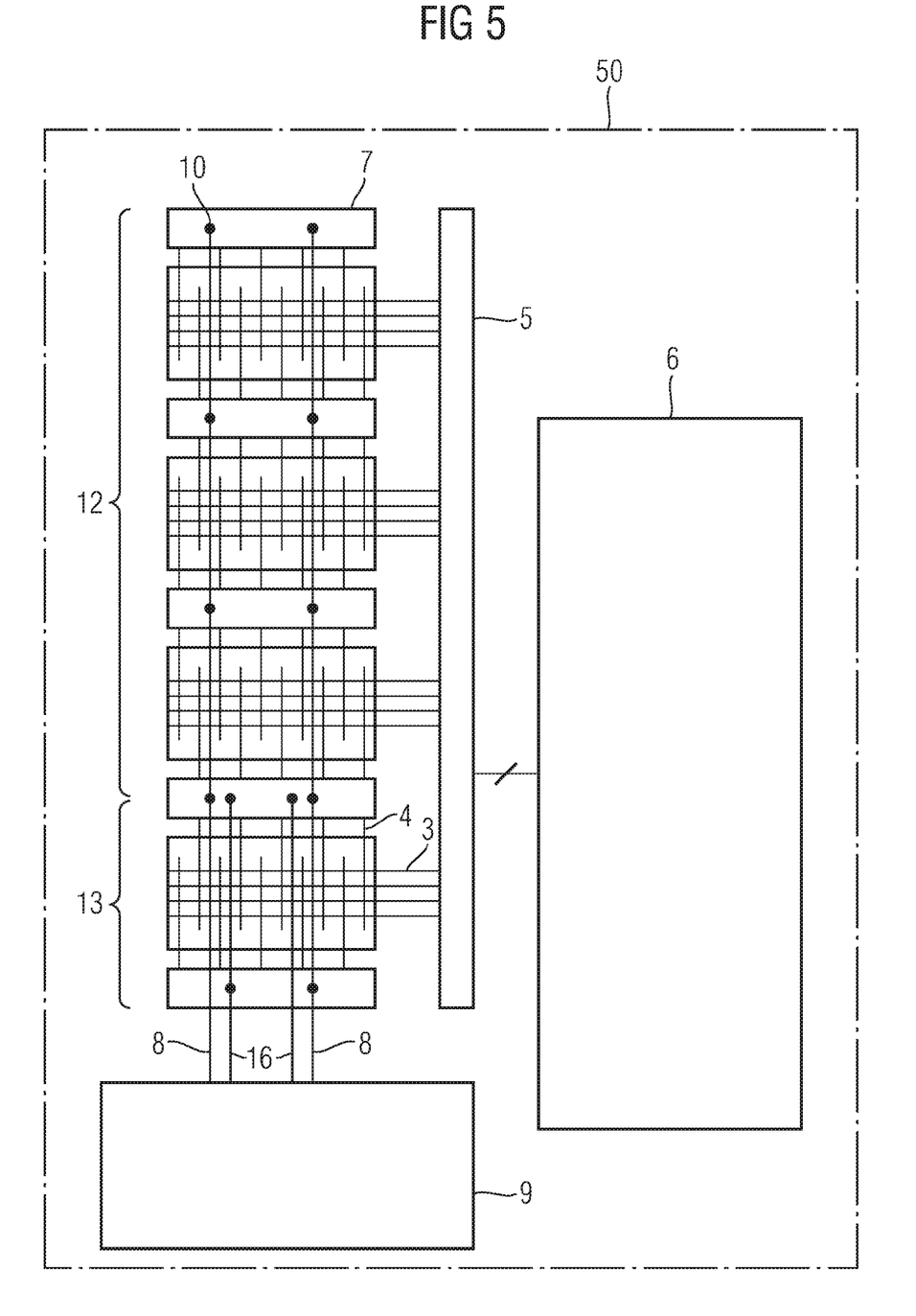
FIG. 5 is a block diagram showing a DRAM memory device according to a fourth embodiment of the present invention.

In FIG. 5, a fourth embodiment of the present invention is shown as memory device 50. As in the previous embodiments, the first set of first memory blocks 12 is designed conventionally, and the second memory block 13 provides a memory block having a shorter array access time. In the embodiment shown in FIG. 5, the signaling delay between the sense amplifier units 7 and the secondary sense amplifier 9 is addressed. To accelerate the transfer of the data between the sense amplifier unit 7 and the secondary sense amplifier 9, different data lines between the first set of first memory blocks 12 and the second memory blocks 13 are provided (i.e., data lines 8 and second data lines 16, respectively). Additionally, the second memory blocks 13 may be physically arranged relatively close to the secondary sense amplifier 9 or closer than the first set (i.e., closest set) of first memory blocks 12. Depending on the row address applied to the memory blocks, either the first data lines 8 or the second data lines 16 are used, which may be selected by multiplexing the two data lines by means of a multiplexer (which may be incorporated along with or in the secondary sense amplifier 9). As the capacitive load of the second data line 16 is substantially reduced due to the shorter length, shorter array access times may be achieved.

The ideas of the embodiments described in the FIGS. 2 to 5 may be combined to further improve access times. For example, the combination of any of the twin-cell-concept, the shortened bitlines, the increased driver capability of the wordline drivers and the use of separated data lines for the first memory blocks and the second memory blocks may be utilized to improve access time. Any other combination of the described embodiments may also be possible.

To have optimized use of the memory devices according to embodiments of the invention, a memory controller having a special functionality for operating the memory device may be provided.

Figure 6:
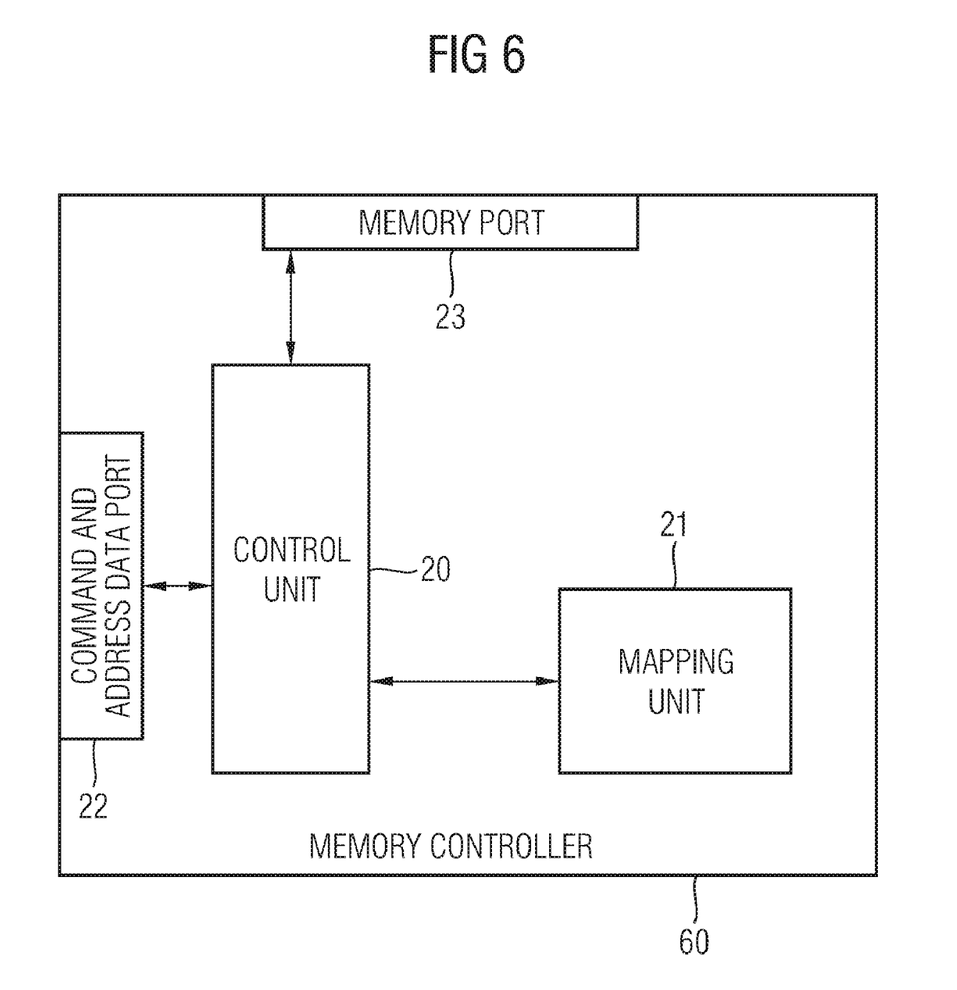
FIG. 6 is a block diagram showing a memory controller according to another aspect of the present invention.

In FIG. 6, a memory controller according to this aspect of the present invention is depicted. The memory controller 60 provides a control unit 20, a mapping unit 21, a command and address and data port 22 and a memory port 23. The memory controller 60 may be implemented as part of a memory device (e.g., as memory control unit 6) or separately from the memory device. The memory port 23 provides a connection to the memory device. The command address data port 22 provides a connection with an operating unit, such as a micro processor, a CPU, etc. The control unit 20 receives command address and data signals from the command address and data port 22 and sends data signals received via the memory port 23 to the command address and data port 22. Command address and data signals are sorted by the control unit 20 and supplied to the memory port 23, though which the signals are transferred to the memory device. The sorting of the command address and data signals may be performed in the control unit 20 according to known schemes and thus this is not described in further detail. The control unit 20 may be configured to detect an indication about which kind of data has to be accessed in a shorter access time than other data and is able to assign the provided data to be transferred via the memory port 23 to the memory device in a first type of data and a second type of data.

The first type of data has the conventional access time while the second type of data is to be accessed with the shortened access time. The determining of which data has to be accessed faster than other data may be carried out by different methods. Especially since random access on conventional memory blocks is time-consuming, data which is generally accessed randomly may be stored in and/or retrieved from the second memory blocks. One example of such data to be randomly accessed is instruction data from operating units, such as the microprocessor, the CPU, etc. The instruction data is conventionally known as the software code. A kind of data which normally is not accessed randomly is so-called bulk data, such as video data, audio data, etc. This kind of data may be accessed in a blockwise manner (burst) and therefore be stored in the first memory blocks. Other kinds of assigning data to the first and second memory blocks are possible, as well. To channel the data to the first and second set of memory blocks, a mapping unit 21 may be provided which is connected to the control units 20. The mapping unit 21 maps the actual address provided via the command address and data port from the outside to the physical address in the memory device connected to the memory controller. Every time the control unit 20 detects that data should be stored in the second set of second memory blocks, the mapping unit 21 is instructed to perform an assignment of a physical address to the actual address of the respective data. If data on the respective actual address is to be deleted or to be canceled, the mapping unit 21 deletes the respective assignment. If an assignment of the actual address to a physical address in the second set of memory blocks is performed, the order of the addresses for addressing the first memory blocks is rearranged so that no memory space is lost when data is directed to the second memory block.

While the foregoing is directed to embodiments of the present invention, other and further embodiments of the invention may be devised without departing from the basic scope thereof, and the scope thereof is determined by the claims that follow.

What is claimed is:

1. An integrated memory device, comprising:
a plurality of memory blocks comprising memory cells, wherein the memory cells are arranged in a matrix of wordlines and bitlines, wherein the plurality of memory blocks comprises:
a first set of memory blocks, wherein the memory cells thereof have a first random access time; and
a second set of memory blocks, wherein the memory cells thereof having a second random access time, and wherein the second random access time is shorter that the first random access time.

2. The memory device of claim 1, wherein the first set of memory blocks includes memory cells arranged on first bitlines, wherein the second set of memory blocks includes memory cells arranged on second bitlines, wherein the second bitlines have smaller bitline capacities than the first bitlines.

3. The memory device of claim 2, wherein the second bitlines are shorter in length than the first bitlines.

4. The memory device of claim 1, wherein the first set of memory blocks includes memory cells arranged on first wordlines and first bitlines, wherein the second set of memory blocks includes memory cells arranged on second wordlines and second bitlines.

5. The memory device of claim 4, further comprising:
an address input port for receiving an address; and
an address decoder configured to selectively activate one of the wordlines depending on the address applied on the address input port.

6. The memory device of claim 5, wherein each second wordline comprises a word line pair.

7. The memory device of claim 6, wherein the second bitlines are shorter in length than the first bitlines.

8. The memory device of claim 6, further comprising:
first sense amplifier units connected to the first bitlines; and
second sense amplifier units connected to the second bitlines, wherein a signal driving capability of the second sense amplifier units is increased compared to the signal driving capability of the first sense amplifier units.

9. The memory device of claim 5, further comprising:
first sense amplifier units connected to the first bitlines; and
second sense amplifier units connected to the second bitlines, wherein a signal driving capability of the second sense amplifier units is increased compared to the signal driving capability of the first sense amplifier units.

10. The memory device of claim 9, wherein the second bitlines are shorter in length than the first bitlines.

11. The memory device of claim 5, further comprising:
one or more wordline drivers disposed respectively on one or more ends of each second wordline.

12. The memory device of claim 11, wherein the second bitlines are shorter in length than the first bitlines.

13. The memory device of claim 12, further comprising:
first sense amplifier units connected to the first bitlines; and
second sense amplifier units connected to the second bitlines, wherein a signal driving capability of the second sense amplifier units is increased compared to the signal driving capability of the first sense amplifier units.

14. The memory device of claim 1, wherein the first set of memory blocks includes memory cells arranged on first bitlines, wherein the second set of memory blocks includes memory cells arranged on second bitlines, wherein the first bitlines are coupled to first sense amplifiers and the second bitlines are coupled to second sense amplifiers, wherein the first sense amplifiers are coupled via a first column decoder to secondary sense amplifiers by means of first data lines, wherein the second sense amplifiers are coupled via a second column decoder to the secondary sense amplifiers by means of second data lines, and wherein the secondary sense amplifiers are arranged physically closer to the second set of memory blocks than the first set of memory blocks.

15. The memory device of claim 14, wherein a driving capability of the second sense amplifier units is increased compared to the driving capability of the first sense amplifier units.

16. The memory device of claim 15, wherein the second bitlines are shorter in length than the first bitlines.

* * * * *